United States Patent [19]
Hamanishi et al.

[11] Patent Number: 5,969,546
[45] Date of Patent: Oct. 19, 1999

[54] COMPARATOR CIRCUIT

[75] Inventors: Naoyuki Hamanishi, Ichikawa; Kazuhiro Oda, Yokohama, both of Japan

[73] Assignee: Kabushiki Kaisha Toshiba, Kawasaki, Japan

[21] Appl. No.: 09/055,900

[22] Filed: Apr. 7, 1998

[30] Foreign Application Priority Data

Apr. 8, 1997 [JP] Japan .................................. 9-089370

[51] Int. Cl.⁶ .................................................. H03K 5/22
[52] U.S. Cl. ................................ 327/67; 327/65; 330/85
[58] Field of Search .................................. 327/65, 66, 67, 327/77, 560–563; 330/259, 260, 85, 9

[56] References Cited

U.S. PATENT DOCUMENTS

| | | | |
|---|---|---|---|
| 4,540,949 | 9/1985 | Haque | 330/85 |
| 5,008,632 | 4/1991 | Sutterlin | 330/256 |
| 5,258,716 | 11/1993 | Kondo et al. | 330/85 |
| 5,362,995 | 11/1994 | Kubo | 327/65 |
| 5,764,095 | 6/1998 | Carobolante | 327/345 |

Primary Examiner—Toan Tran
Attorney, Agent, or Firm—Oblon, Spivak, McClelland, Maier & Neustadt, P.C.

[57] ABSTRACT

In a comparator circuit comprised of a feedback amplifier and a differential amplifier AMP1, the feedback amplifier includes input transistors Tr1 to Tr4. Gates of the transistors Tr1 and Tr2 are respectively inputted with first and second inverted inputs, and gates of the transistors Tr3 and Tr4 are inputted with first and second non-inverted inputs. First ends of current paths of the transistors Tr3 and Tr4 are connected in common, and ends of current paths of transistors Tr1 and Tr2 are connected in common. Second ends of the current paths of the transistors Tr1 to Tr4 are connected in common to a constant current source. The first and second inverted inputs are supplied with a reference voltage, and the first and second non-inverted inputs are respectively supplied with the non-inverted and inverted outputs of the differential amplifier AMP1. A signal from a connection point common to the first ends of the current paths of the transistors Tr3 and Tr4 is supplied as a feedback output to the differential amplifier AMP1 to control operation of the differential amplifier AMP1. The timing when feedback is performed to stabilize the operating point of the differential amplifier AMP1 is the timing when the non-inverted and inverted outputs of the differential amplifier AMP1 have a small potential difference therebetween or are substantially equal to each other.

8 Claims, 3 Drawing Sheets

COMPARATOR CIRCUIT

BACKGROUND OF THE INVENTION

The present invention relates to a comparator circuit used for an analog circuit technique and a digital/analog conversion technique.

Conventionally, in a circuit technique such as a differential chopper comparator or the like, an amplifier for feedback is generally used to stabilize an operating point at a certain reference voltage VREF.

FIG. 4 is a circuit configuration of a conventional comparator circuit having a feedback amplifier. Resistor elements R1 and R2 are used to prepare an intermediate voltage Vm between two outputs from a differential amplifier (or comparator) AMP1 as a level detector. A difference between the voltage Vm and the reference voltage VREF is amplified by the feedback amplifier and fed back to the AMP1, thereby to stabilize the operating point of the AMP1.

The structure as described above uses those resistor elements R1 and R2 that occupy a considerably large occupation area among circuit elements. However, if the occupation area is reduced to downsize the resistor elements, the resistance value is reduced and involves a problem that the gain of the outputs from the comparator (or outputs from the AMP1). In order to prevent decreases of the gain of the comparator outputs, the resistance values must be large and the occupation area of the resistors must accordingly be large.

Thus, in a conventional comparator circuit which uses a feedback amplifier for stabilizing an operating point, a feedback amplifier structure uses resistor elements which cause a problem that the occupation area of the resistor elements on a semiconductor chip is enlarged.

BRIEF SUMMARY OF THE INVENTION

The present invention has been made in view of the above situation and has an object of providing a comparator circuit whose size is reduced by adopting a feedback amplifier which does not use a resistor element.

According to the present invention, there is provided a comparator circuit comprising: a differential amplifier having non-inverted and inverted output terminals; and a feedback amplifier including first, second, third, and fourth input transistors and having a first non-inverted input terminal connected to the non-inverted output terminal of the differential amplifier, a second non-inverted input terminal connected to the inverted output terminal of the differential amplifier, a first inverted input terminal connected to a reference voltage terminal, a second inverted input terminal connected to the reference voltage terminal, and an output terminal, wherein the first input transistor has a gate forming the first non-inverted input terminal to receive a non-inverted output signal from the non-inverted output terminal of the differential amplifier, the second input transistor has a gate forming the second non-inverted input terminal to receive an inverted output signal from the inverted output terminal of the differential amplifier, the third input transistor has a gate forming the first inverted input terminal and applied with a reference voltage, the fourth input transistor has a gate forming the second inverted input terminal and applied with the reference voltage, the first input transistor has a current path having a first end connected to a first end of a current path of the second input transistor, the third input transistor has a current path having a first end connected to a first end of a current path of the fourth input transistor, the current paths of the first, second, third, and fourth input transistors have second ends connected in common to a constant current source, a connection point between the first end of the current path of the third input transistor and the first end of the third input transistor forms the output terminal of the feedback amplifier, and operation of the differential amplifier is controlled by an output signal from the output terminal.

The operating point of the differential amplifier may be stabilized when the non-inverted output signal from the non-inverted output terminal and the inverted output signal from the inverted output terminal have a small potential difference therebetween or are substantially equal to each other.

The differential amplifier and the feedback amplifier may form a chopper comparator circuit.

The first, second, third, and fourth input transistors may have substantially equal characteristics.

The constant current source may comprise a transistor.

The first ends of the current paths of the first and second input transistors may be connected to a power source through a first load element, and the first ends of the third and fourth input transistors may be connected to the power source through a second load element.

The first and second load elements may have substantially equal characteristics.

The first and second load elements may comprise transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 5:
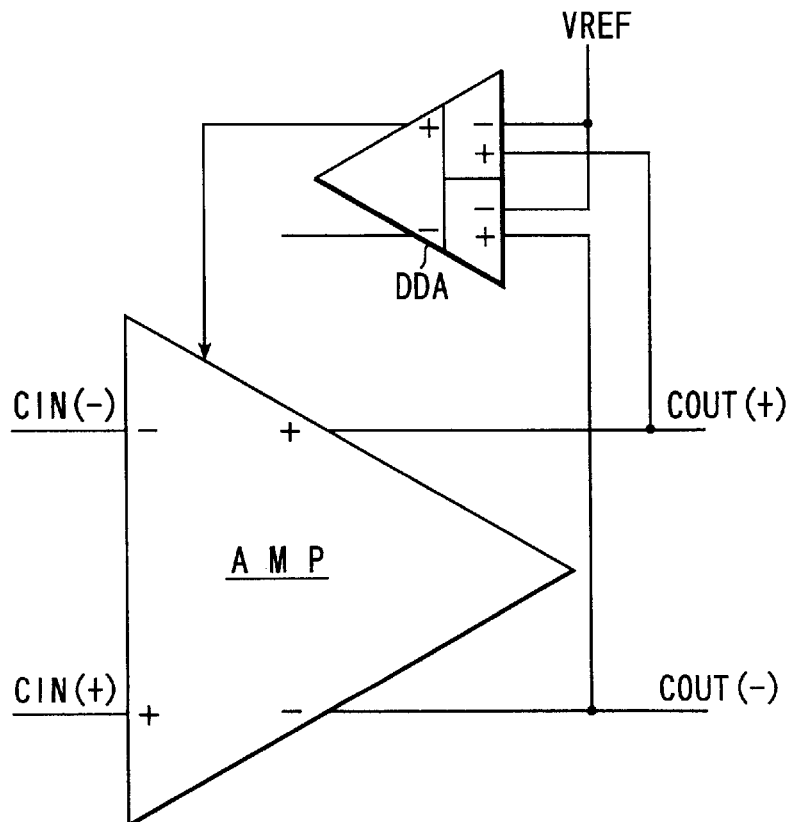
FIG. 5 is a circuit configuration of a comparator circuit as a prerequisite of the present invention, which uses a DDA for feeding back multiple inputs to stabilize an operating point of the comparator.

As a prerequisite of the present invention, a circuit adopting a DDA (Differential Difference Amplifier) has been considered as a feedback amplifier for stabilizing an operating point of the comparator (FIG. 5). The DDA is specifically described in "A Versatile Building Block: The CMOS Differential Difference Amplifier", IEEE J. Solid-state Circuits, vol. sc-22, pp. 287, April 1987.

According to the circuit shown in FIG. 5, feedback is obtained such that a sum of voltages of two output signals is twice the reference voltage VREF. The operating point is thus stabilized so that resistors are not used. However, the DDA is comprised of a plurality of amplifiers which complicate the circuit structure itself. The circuit structure therefore requires high costs and a slightly large area, making it difficult to adopt the DDA.

The present invention has an object of constructing a comparator circuit which has a simple circuit structure, occupies only a small area, and attains a stable operating point.

In case of a circuit structure like a differential chopper comparator which short-circuits the input and output of a differential amplifier to each other, stabilization of the operating point does not require a linear characteristic like a DDA. This means that the operating point needs to be stabilized only when the voltages of two output signals (VOUT (+) and VOUT (−)) become substantially equal to each other immediately before the timing at which input voltages are compared with each other. Taken into consideration this respect, the present invention performs feedback to stabilize the operating point only when the voltages of two output signals (VOUT(+) and VOUT(−)) are substantially equal to each other immediately before the input voltages are compared with each other. As a result, the operating point can be stabilized by a feedback amplifier constructed in one stage.

Figure 1:
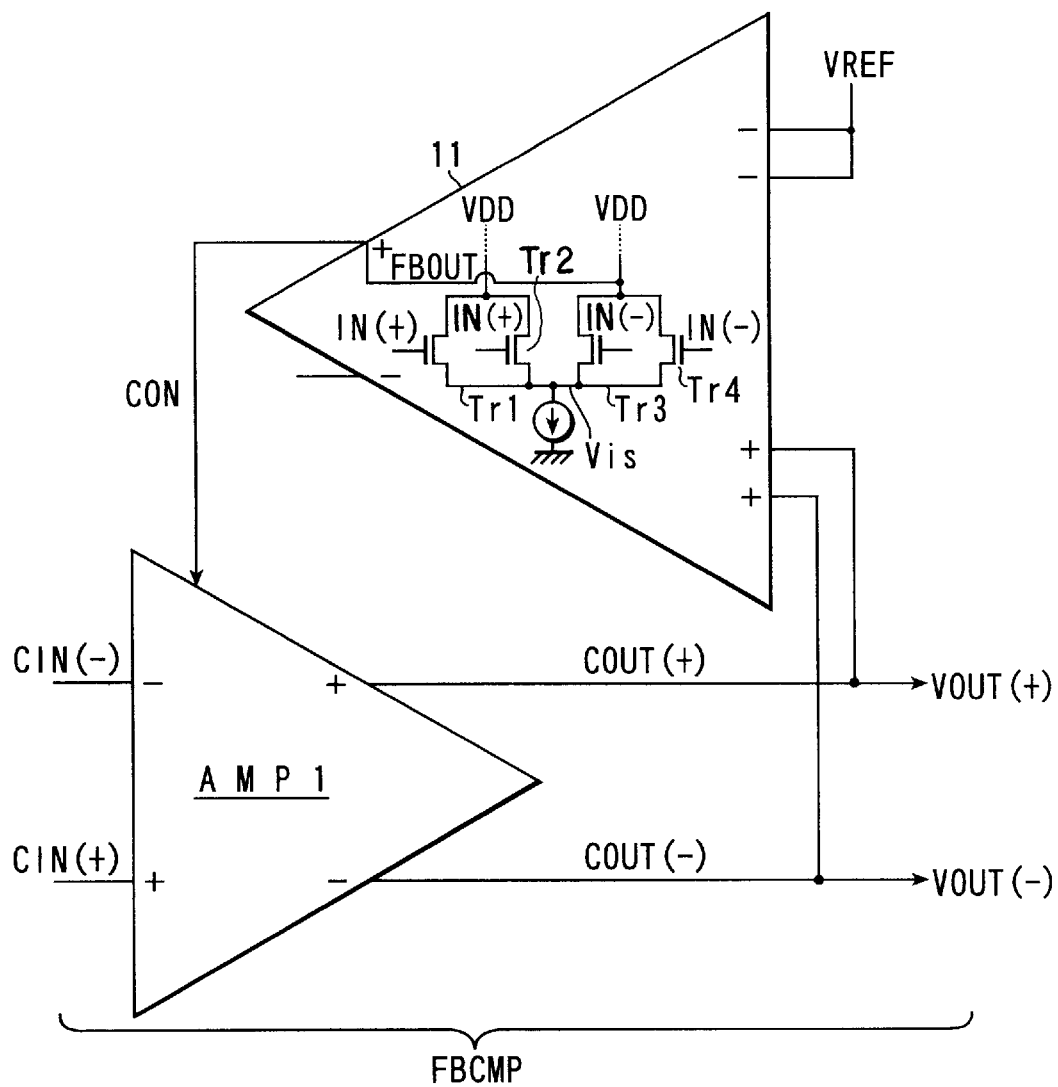
FIG. 1 is a view showing the concept of the comparator circuit in form of a block diagram.

FIG. 1 shows the concept of the structure of the comparator circuit according to the present invention in form of a block diagram. The comparator circuit has an amplifier 11 for feedback which stabilizes the operating point.

The feedback amplifier 11 operates such that a feedback signal CON is applied to a differential amplifier (or comparator) AMP1 only when two output signals (of an inverted output signal VOUT (−) and a non-inverted output signal VOUT (+)) from the differential amplifier AMP1 as a level detector become substantially equal to each other under control of a switch (not shown) based on a clock signal. Therefore, transistors Tr1 and Tr2 in an input stage of the feedback amplifier 11, as well as transistors Tr3 and Tr4, are applied with voltages substantially equal to each other, so that the feedback amplifier 11 needs not have a linear characteristic like a DDA. Accordingly, the operating point of the differential amplifier AMP1 can be stabilized by the feedback amplifier 11 having a one-stage structure. Since a resistor is not used, the gain of the output of the comparator is considerably large and it is possible to eliminate an occupation area which will otherwise be required by using a resistor. Details of the structure and operation of the comparator circuit shown in FIG. 1 will be described later with reference to FIG. 3.

Figure 2:
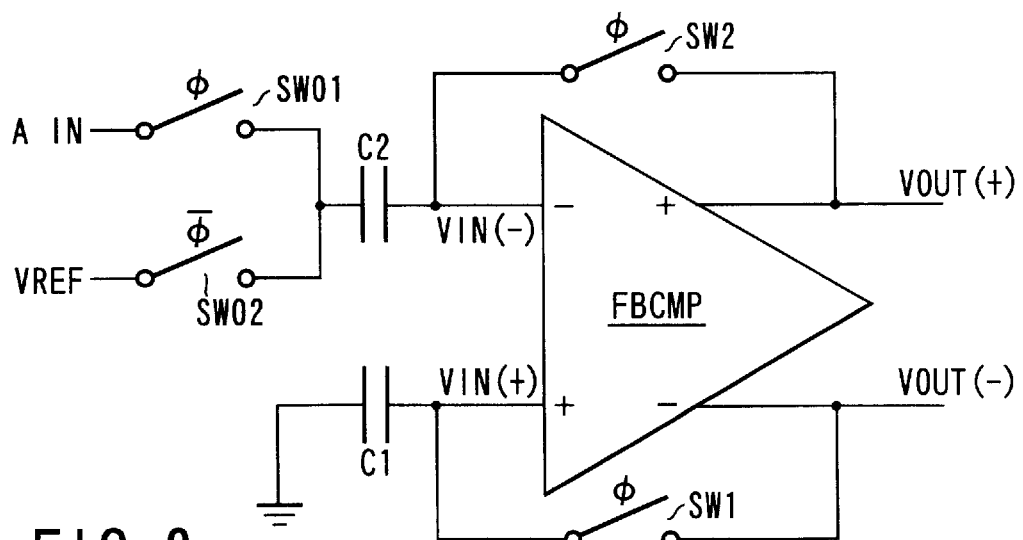
FIG. 2 is a circuit configuration where the comparator circuit (FBCMP) of the present invention is applied to a differential chopper comparator.

FIG. 2 is a circuit configuration showing an embodiment where the comparator circuit (FBCMP) of the present invention is adopted in a differential chopper comparator.

Switches SW01 and SW02 are respectively controlled by a clock signal φ and a complementary clock signal /φ thereof (indicated with an upper line in the figure), and an analog input Ain and a reference voltage VREF are complementarily inputted to the comparator circuit FBCMP. The switches SW1 and SW2 are controlled by the clock signal φ. The switches SW1 and SW2 are turned on by the clock signal φ (in a mode controlled a auto-zero mode) and the input and output terminals of the comparator circuit are short-circuited to each other. When the switches SW1 and SW2 are turned on and the input and output terminals of the comparator circuit are short-circuited to each other, the operating voltage of the comparator circuit FBCMP is stabilized at a certain voltage Vop. At this time, the following electric charge Q1 is stored in the capacity C2 applied with the analog input Ain.

$$Q1=C2(Vop-Ain) \qquad (1)$$

When the switch SW01 is next turned off and the switch SW02 is turned on, Q1 remains unchanged and the voltage Vin(−) of the inverted input terminal of the comparator circuit becomes as follows.

$$Vin(-)=(VREF-Ain)+Vop \qquad (2)$$

Meanwhile, the voltage Vin(+) of the non-inverted input terminal is unchanged since the input voltage to the non-inverted input terminal is not changed. The following is obtained.

$$Vin=Vop \qquad (3)$$

Therefore, comparison of input voltage levels of the VREF and Ain is carried out by the comparator circuit FBCMP.

In the embodiment described above, the input and output terminals of the comparator circuit FBCMP are short-circuited to each other. Since a comparator generally has a very small offset, two output signals COUT(+) and COUT (−) become substantially equal to each other at this time. Therefore, at this time, i.e., when the voltages of two output signals (VOUT(+) and VOUT(−)) become substantially equal to each other where a feedback amplifier 11 as shown in FIG. 1 is incorporated together, the operating point of the comparator circuit FBCMP can be stabilized by performing feedback by the feedback amplifier 11.

In FIG. 1, for example, when the outputs COUT(+) and COUT(−) of the differential amplifier AMP1 are changed so greatly that the input transistor Tr1 of the feedback amplifier 11 is turned off, amplification is performed by the transistor Tr2 and the two transistors Te3 and Tr4 inputted with VREF. Feedback is then performed to satisfy the following equation where Vog is the input voltage of the transistor (Tr2) turned on, Vth is the threshold voltage of each of transistors Tr1, Tr2, Tr3, and Tr4, and Vis is the voltage of a common source connected in common to the transistors Tr1, Tr2, Tr3, and Tr4.

$$2(VREF-Vis-Vth)=(Vog-Vis-Vth) \qquad (4)$$

Hence, Vref≠Vog exists and the operating point is thereby shifted.

In order to avoid the shift of the operating point in the comparator circuit FBCMP of the present invention, the timing at which feedback is performed for stabilizing the operating point is set to a time point when the non-inverted output signal and the inverted output signal have a small potential difference therebetween or have potentials substantially equal to each other.

Figure 3:
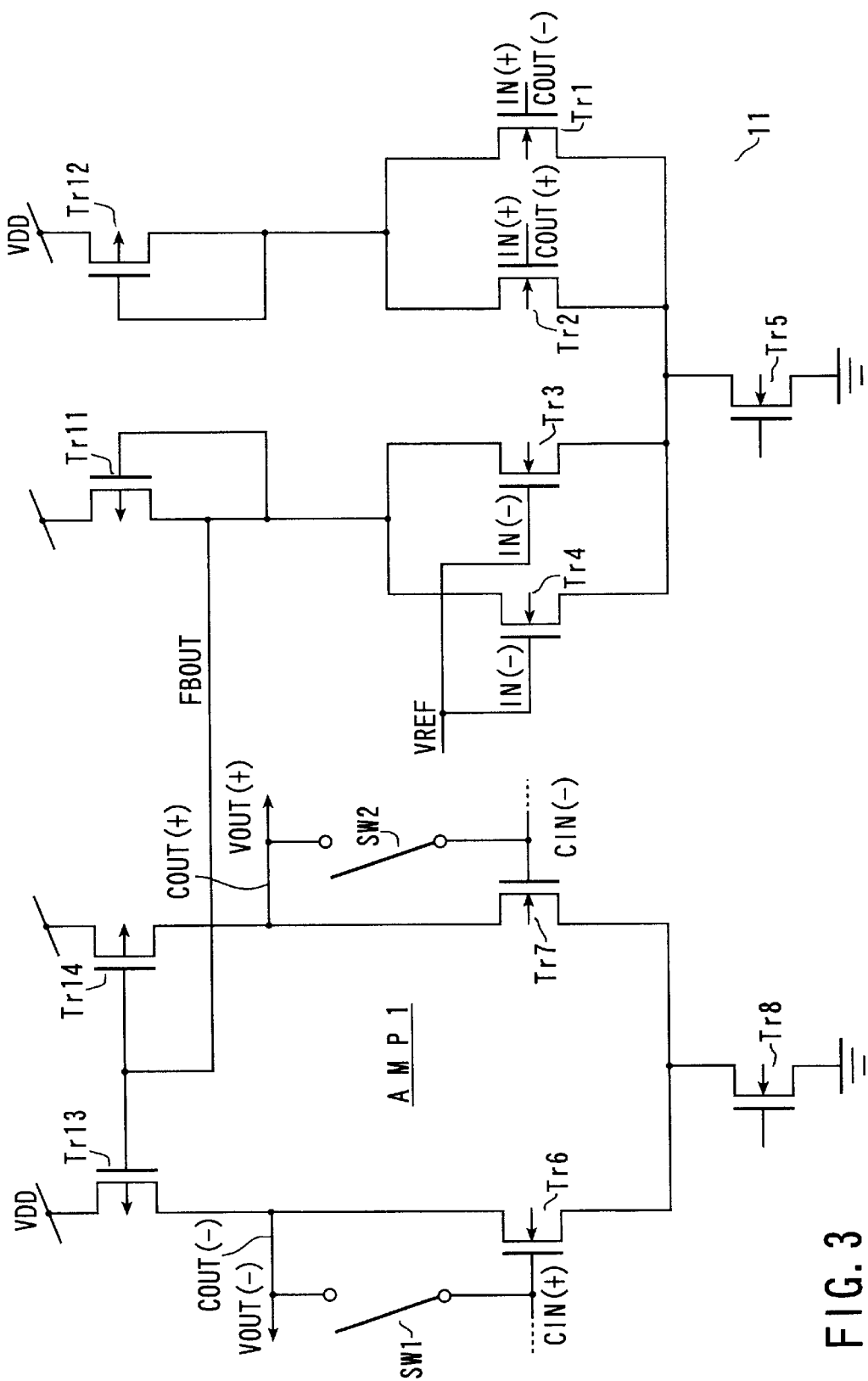
FIG. 3 is a specific circuit configuration of the comparator circuit shown in FIG. 1.
Figure 4:
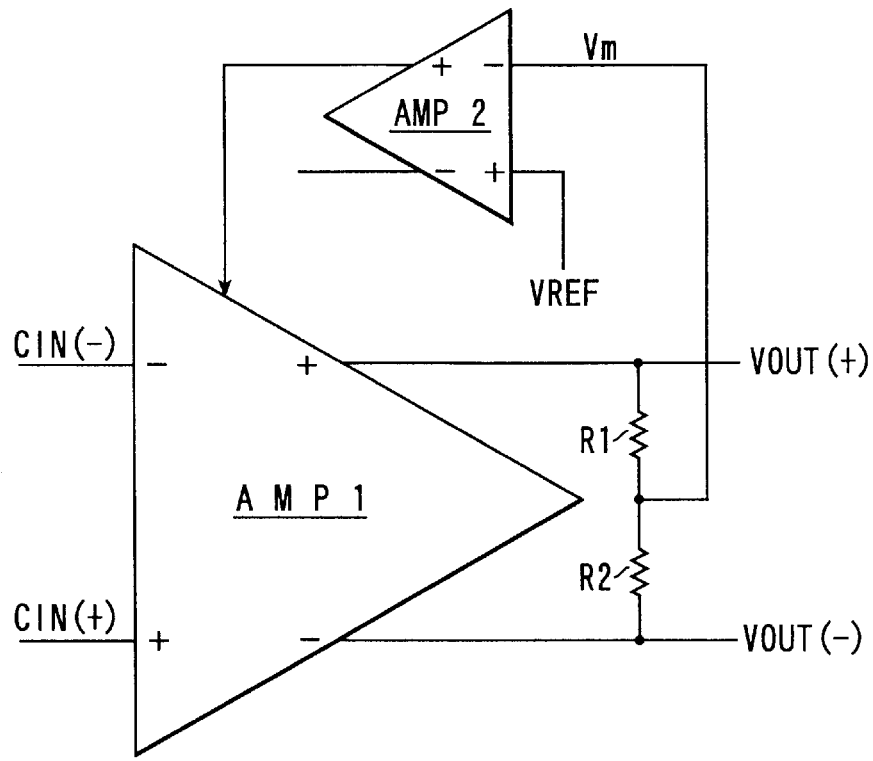
FIG. 4 is a circuit configuration of a conventional comparator circuit having a feedback amplifier for stabilizing an operating point.

FIG. 3 is a specific circuit configuration of the comparator circuit (FBCMP) shown in FIG. 1.

In AMP1 as a comparator, sources of P-channel MOS transistors Tr13 and Tr14 are connected to a power source VDD, and a power VCC is supplied through the P-channel MOS transistors Tr13 and Tr14. The transistors Tr13 and 14 have gates connected in common, and the common gate is supplied with a control output signal FBOUT from a feedback amplifier 11 described later.

Drains of the transistors Tr13 and Tr14 are respectively connected to drains of N-channel MOS transistors Tr6 and Tr7. Sources of the transistors Tr6 and Tr7 are connected in common and grounded through a N-channel MOS transistor Tr8 which prepares a constant current source. Gates of the transistors Tr6 and Tr7 respectively constitute a non-inverted input terminal for receiving a non-inverted input signal (CIN(+)) and an inverted input terminal for receiving an inverted input signal (CIN(−)). A connection point between drains of the transistors Tr6 and Tr13 constitute an inverted output terminal for outputting an inverted output signal (COUT(−) and VCOUT(−)). A connection point between drains of the transistors Tr7 and Tr14 constituted a non-inverted output terminal for outputting a non-inverted output signal (COUT(+) and VOUT(+)). The non-inverted input terminal (CIN(+)) and the inverted output terminal (COUT(−) and VOUT(−)) are short-circuited to each other under control of the switch SW1. The inverted input terminal (CIN(−)) and the non-inverted output terminal (COUT(+) and VOUT(+)) are short-circuited under control of the switch SW2.

In the feedback amplifier 11, the source of the P-channel MOS transistor Tr11 having a gate and drain connected to each other is connected to a power source VDD, and the power source VDD is supplied through the transistor 11. The source of the P-channel MOS transistor Tr12 having a gate and drain connected to each other is connected to a power source VDD, and the power source VDD is supplied through the transistor Tr12. The P-channel MOS transistors Tr12 and Tr12 constitute load elements and have substantially equal characteristics. The drain of the transistor Tr12 is connected in common to the drains of the transistors Tr1 and Tr2, and the gates of the transistors 1 and 2 are connected to the inverted output terminal (COUT(−)) and non-inverted output terminal ((COUT(+)) for receiving the inverted output signal (COUT(−)) and non-inverted output (COUT(+)), respectively. The drain of the transistor Tr11 is connected in common to the drains of the transistors Tr3 and Tr4. Each of gates of the transistors Tr3 and Tr4 is supplied with a reference voltage VREF. The sources of the transistors Tr1 to Tr4 are connected in common and are grounded through a N-channel MOS transistor Tr2 for preparing a constant current source. The transistors Tr1 to Tr4 have substantially equal characteristics. The drain of the transistor Tr11 constitutes a control output terminal, and a control output signal FBOUT is outputted through the drain. The drain of the transistor Tr11, i.e., the control output terminal of the feedback amplifier 11 is connected to a common gate of the P-channel MOS transistors Tr13 and Tr14, and the common gate is supplied with the control output signal (or feedback output signal) FBOUT of the feedback amplifier 11.

In the comparator circuit constructed in the structure described above, the switches SW1 and SW2 are turned on during the auto-zero mode, and the signals CIN(−) and COUT(+) are short-circuited. Since the offset of an amplifier is generally very small, two output signals COUT(+) and COUT(−) are at substantially equal potentials at this time when the signals CIN(+) and COUT(−) as well as the signals CIN(−) and COUT(+) are shorted circuited. Therefore, the feedback amplifier needs not have a linear characteristic like a DDA but is capable of stabilizing the operating point of the comparator circuit by one stage of a feedback amplifier comprised of transistors Tr1 to Tr4.

Accordingly, the present invention is suitable for a comparator circuit which satisfies the operating condition that feedback is performed to stabilize the operating point at a certain reference voltage only when two output voltages (of non-inverted and inverted outputs) of a differential amplifier as a comparator have a small difference therebetween and are substantially equal to each other. It is possible to realize a comparator circuit which has a simple circuit structure and attains a large gain.

As has been explained above, according to the present invention, it is possible to provide a comparator circuit having a simple circuit structure, which occupies a small area and attains a large gain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A comparator circuit comprising:

a differential amplifier having non-inverted and inverted output terminals; and a feedback amplifier including first, second, third, and fourth input transistors and having a first non-inverted input terminal connected to the non-inverted output terminal of the differential amplifier, a second non-inverted input terminal connected to the inverted output terminal of the differential amplifier, a first inverted input terminal connected to a reference voltage terminal, a second inverted input terminal connected to the reference voltage terminal, and an output terminal, wherein the first input transistor has a gate forming the first non-inverted input terminal to receive a non-inverted output signal from the non-inverted output terminal of the differential amplifier, the second input transistor has a gate forming the second non-inverted input terminal to receive an inverted output signal from the inverted output terminal of the differential amplifier, the third input transistor has a gate forming the first inverted input terminal and applied with a reference voltage, the fourth input transistor has a gate forming the second inverted input terminal and applied with the reference voltage, the first input transistor has a current path having a first end connected to a first end of a current path of the second input transistor, the third input transistor has a current path having a first end connected to a first end of a current path of the fourth input transistor, the current paths of the first, second, third, and fourth input transistors have second ends connected in common to a constant current source, a connection point between the first end of the current path of the third input transistor and the first end of the fourth input transistor forms the output terminal of the feedback amplifier, and operation of the differential amplifier is controlled by an output signal from the output terminal.

2. A comparator circuit according to claim 1, wherein the differential amplifier has an operating point which is stabilized when the non-inverted output signal from the non-inverted output terminal and the inverted output signal from the inverted output terminal have a small potential difference therebetween or are substantially equal to each other.

3. A comparator circuit according to claim 1, wherein the differential amplifier and the feedback amplifier form a chopper comparator circuit.

4. A comparator circuit according to claim 1, wherein the first, second, third, and fourth input transistors have substantially equal characteristics.

5. A comparator circuit according to claim 1, wherein the constant current source comprises a transistor.

6. A comparator circuit according to claim 1, wherein the first ends of the current paths of the first and second input transistors are connected to a power source through a first load element, and the first ends of the third and fourth input transistors are connected to the power source through a second load element.

7. A comparator circuit according to claim 6, wherein the first and second load elements have substantially equal characteristics.

8. A comparator circuit according to claim 6, wherein the first and second load elements comprises transistors.

\* \* \* \* \*